United States Patent [19]

Morgan

[11] Patent Number: 5,056,889
[45] Date of Patent: Oct. 15, 1991

[54] OPTICAL DEVICE INCLUDING A GRATING

[75] Inventor: Robert A. Morgan, Topton, Pa.

[73] Assignee: AT&T Bell Laboratories, Murray Hill, N.J.

[21] Appl. No.: 458,851

[22] Filed: Dec. 29, 1989

[51] Int. Cl.[5] .............................................. G02B 5/18
[52] U.S. Cl. .................................. 359/572; 359/574; 359/573; 372/45
[58] Field of Search ...................... 350/162.16, 162.20, 350/162.21, 162.22, 162.23, 162.24; 372/45, 90

[56] References Cited

U.S. PATENT DOCUMENTS

| 4,815,084 | 3/1989 | Scifres | 372/45 X |
| 4,817,105 | 3/1989 | Yano | 372/50 |
| 4,869,568 | 9/1989 | Schimpe | 350/162.23 X |

OTHER PUBLICATIONS

Applied Physics Letters, 50, pp. 273-275, Feb. 2, 1987 (Levine et al.).
Applied Physics Letters, 53, pp. 296-298, Jul. 25, 1988 (Levine et al.).
Applied Physics Letters, 47, pp. 1257-1259, Dec. 15, 1985 (Goossen et al.).
Applied Physics Letters, 53, pp. 1027-1029, Sep. 19, 1988 (Goossen et al.).

Primary Examiner—Scott J. Sugarman
Attorney, Agent, or Firm—R. D. Laumann

[57] ABSTRACT

Substrate-supported optical device structures such as, e.g. quantum-well infrared detectors/detector arrays are provided with a grating for optical coupling. A binary, reflection grating is designed so that nh is approximately equal to $\lambda/4$ where n is the refractive index of the grating, h is the thickness of the grating, and $\lambda$ is a wavelength of interest.

5 Claims, 1 Drawing Sheet

OPTICAL DEVICE INCLUDING A GRATING

CROSS-REFERENCE TO RELATED APPLICATION

Filed of even data is a patent application designated as G. C. Chi-J. N. Hollenhorst-Robert A. Morgan-D. J. Muehlner-Case 3-1-3.

TECHNICAL FIELD

The invention is concerned with optical devices comprising a grating.

BACKGROUND OF THE INVENTION

For the detection or modulation of optical radiation, especially at infrared frequencies, devices based on intersubband or bound-to-continuum excitation of carriers in quantum wells have been disclosed in *Applied Physics Letters*, 50, pp. 273-275, Feb. 2, 1987 (Levine et al. I) and *Applied Physics Letters*, 53, pp. 296-298, July 25, 1988 (Levine et al. II). The former article discloses intersubband absorption and the latter article discloses bound to continuum absorption.

The devices described include a substrate supported layered structure having quantum wells between barrier layers. The devices have interleaved wide and narrow bandgap layers and are expediently implemented, e.g. by means of doped gallium arsenide well layers and aluminum gallium arsenide barrier layers on a gallium arsenide substrate. At least one narrow bandgap layer forms a quantum well. Suitable choices of layer thicknesses and compositions permit the devices to have peak absorption at any desired wavelength in the "atmospheric window" region extending from 8 to 14 micrometers. The devices are considered suitable for use in, e.g. focal-plane arrays, high-speed detectors, optical heterodyne receivers, and vertically integrated infrared spectrometers.

However, due to quantum mechanical selection rules, absorption in these devices depends upon the direction of the incident radiation with respect to the layered structure, and there is essentially zero absorption for radiation which is incident perpendicular to the layered structure. A waveguide configuration permits light absorption but is not easily implemented; grating couplers have been proposed to increase the absorption efficiency. For example, *Applied Physics Letters*, 47, pp. 1257-1259, Dec. 15, 1985, discloses the use of a grating to enhance the absorption efficiency. The grating, patterned GaAs covered by a metallic layer, was designed to convert incident radiation into evanescent modes with an electric field component perpendicular to the quantum well layers, thus permitting it to be absorbed. Additionally, *Applied Physics Letters*, 53, pp. 1027-1029, Sept. 19, 1988, describes a structure similar to that of the previous article, but which absorbs light also by diffracting the incident radiation back through the layered structure. The diffracted radiation is not normal to the quantum well layers and may thus be absorbed.

SUMMARY OF THE INVENTION

An optical device structure comprising a multi-layered structure having a quantum well region and grating means for coupling optical radiation into said quantum well region with the grating means design introducing an optical path difference of $\pi$ between adjacent teeth. For a binary grating used in reflection, the grating means design relationship is approximately $nh = \lambda/4$ where n is the refractive index of the grating means material, h is the thickness of the grating, and $\lambda$ is the principal wavelength of interest. The quantum well region has at least one narrow bandgap layer that forms a quantum well. The grating diffracts the incident radiation into the quantum well region where it is absorbed as the propagation constant has a significant non-normal component. The phase shift of $\pi$ minimizes reflection in the zeroth order.

The grating layer material may be different from the quantum well region material so that, conveniently, the quantum well region material acts as an etch stop during fabrication. For example, on a GaAs-AlGaAs device, polycrystalline silicon can be formed and etched in this fashion to form the grating.

DETAILED DESCRIPTION

Figure 1:
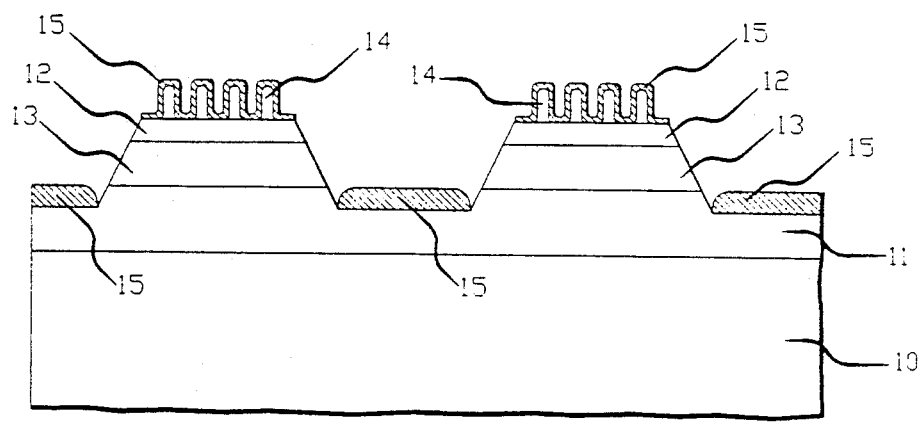
FIG. 1 is a schematic elevational view of a device comprising a plurality of optical detectors having gratings in accordance with a preferred embodiment of the invention.

FIG. 1 shows a device structure comprising substrate 10, first and second contact layers 11 and 12, quantum well region 13, having interleaved wide and narrow bandgap layers with at least one narrow bandgap layer forming a quantum well, grating structure 14, and contacts 15. For reasons of clarity, the elements of the device depicted are not drawn to scale.

Materials will be readily selected by those skilled in the art. Layers 11 and 12 and region 13 will typically comprise Groups III-V materials, although the use of Groups II-VI and mixed Group IV materials is contemplated. The contact layers will typically be heavily doped semiconductors to facilitate charge collection. These materials are well known to those skilled in the art and their growth is understood and easily practiced. In a preferred embodiment, the Group III-V materials are GaAs and Al GaAs. Grating materials will also be readily selected. For example, polycrystalline silicon may be used. The grating design will be discussed in detail later. Contact materials will be readily selected by those skilled in the art. An appropriate fabrication sequence will be readily selected by those skilled in the art, and it need not be discussed in detail.

The terms "wide" and "narrow" bandgap deserve some explanation. The photodetector preferably uses bound state to continuum excitation of carriers for light absorption. The wide and narrow bandgap layers should have bandgaps and layer thicknesses selected so that there is only a single bound, electron state in the narrow, or quantum well, bandgap layer.

Figure 2:
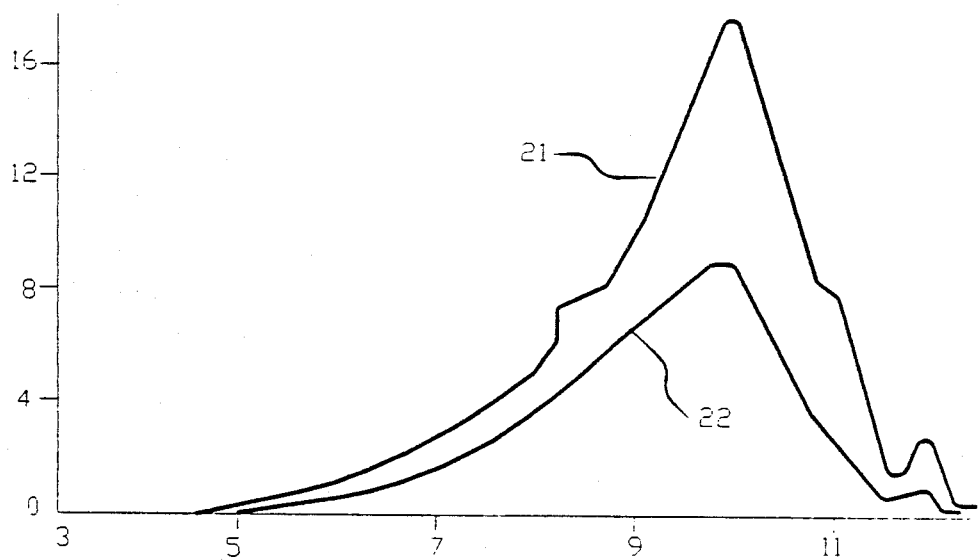
FIG. 2 is a diagram representing experimentally determined relationship between wavelength and radiation flux responsivity for a preferred device in accordance with the invention.

FIG. 2 shows curves 21 and 22 with curve 21 corresponding to a preferred embodiment of the invention, including a grating, and curve 22 corresponding to a prior art device illuminated obliquely via a 45-degree beveled face in the substrate. The curves represent flux responsivity plotted vertically in units of $\mu A/W$ cm$^2$ versus wavelength plotted horizontally in units of $\mu m$. The radiation source was a 500° C. blackbody, and the detector was cooled to a temperature of 77° K. Superior responsivity of a device, including a grating, is readily apparent upon comparison of curve 21 and curve 22.

The device is designed to optimize photocurrent, assuming that the noise does not increase disproportionately, when radiation is received from what is typically referred to as a black body or thermal radiation source. Deviations from the idealized relationship disclosed of 15 percent or less result in such optimization. The grating design involves choice of grating layer thickness and refractive index structure, e.g., a binary grating with a 50 percent duty cycle, and grating period. For a binary grating used in reflection, the preferred grating layer thickness is inversely related to the refractive index of the grating material, in accordance with the idealized grating means design relationship, $$nh = \lambda/4,$$

where $\lambda$ is a wavelength of interest, is n is the refractive index of the grating layer material, and h is the grating layer thickness. As explained, this is an idealized relationship and there may be deviations from equality as large as 15 percent. A typical wavelength of interest is the peak of the black body emission spectrum. For the reflection grating depicted, this relationship introduces a phase shift of $\pi$. A grating conforming to the idealized relationship minimizes the zeroth order. For example, with $\lambda = 10$ micrometers, and $n = 3.4$ (as for silicon), the preferred grating layer thickness, h is approximately 0.75 micrometer. If the grating is used in transmission, the relationship is $(n_2 - n_1) h = \lambda/2$. In the interest of minimized grating layer thickness, high-index materials are preferred as grating materials. The efficacy of a grating may be enhanced also by suitable choice of an overlying material, e.g. a contact metallization material.

The preferred period of the grating depends on the direction of radiation incidence and may be motivated by the desire for a first-order diffracted beam to propagate in a direction parallel to the layered structure. For example, in the case of perpendicular incidence, a preferred grating period is approximately $d = \lambda/n$ for a wavelength of interest.

As illustrated by FIG. 1, a grating may have a rectangular profile and is disposed on the quantum well region. Among alternative gratings within the scope of the invention are triangular profiles, and fabrication of the grating on the substrate. Also, gratings may be present on the device structure as well as on the substrate. Preferred gratings can readily serve, e.g. to couple radiation into 2-dimensional focal-plane detector arrays.

The devices will typically be detecting thermal or black-body radiation which is, of course, a continuum, rather than radiation of essentially a single wavelength. For design purposes, the wavelength of interest is conveniently taken as the peak of the black body emission spectrum. Detailed consideration of the shape of the source and absorption spectra may lead to deviations from equality of the idealized relationship that are as large as 15 percent. The term "approximately" when and in conjunction with the idealized relationship means that deviations from equality are 15 percent or less of nh.

A device whose performance is illustrated in FIG. 2, curve 21, was made according to the following example. The numerical values are either nominal or approximate.

EXAMPLE

On a semi-insulating gallium arsenide substrate, a 1-micrometer first contact layer of gallium arsenide was deposited (doped $n = 2 \times 10^{18}$ cm$^{-3}$), followed by a detector structure consisting of 50 periods of 4-nanometer gallium arsenide quantum-well layers (doped $n = 2 \times 10^{18}$ cm$^{-3}$) between 30-nanometer Al$_{0.26}$Ga$_{0.74}$As undoped barrier layers (resulting in a barrier height of approximately 250 meV). A second contact layer of 0.5 micrometer gallium arsenide was deposited, doped $n = 2 \times 10^{18}$ cm$^{-3}$. Layers as described above were deposited by molecular-beam epitaxy.

On the second contact layer, a 750-nanometer layer of polysilicon was deposited by e-beam evaporation. A 4-micrometer-period grating was formed in the polysilicon layer by reactive-ion etching, with a photoresist layer as etch mask. The etching gas was approximately 95 percent $CF_4$ and 5 percent oxygen by volume. The second contact layer (underlying the polysilicon layer) was used as an etch stop. Scanning-electron-microscopic inspection showed that the grating had an essentially square profile, with a 1.9-micrometer/2.1-micrometer duty cycle. A 50 percent duty is optimum.

After formation of the grating as described, a mesa structure having an approximate diameter of 250 micrometers was chemically etched in the presence of a photoresist mask. Metallic contact layers were deposited by sequential e-beam evaporation of germanium-gold (20 nanometers), silver (50 nanometers), and gold (75 nanometers) in the presence of a lift-off mask.

Variations will be readily apparent to those skilled in the art.

I claim:

1. A device comprising a substrate, a quantum well region on said substate, said region comprises interleaved wide and narrow bandgap layers, at least one of said narrow bandgap layers comprising a quantum well, grating means for coupling optical radiation into said quantum well region, characterized in that grating means design introduces a phase shift of $\pi$ between adjacent teeth.

2. A device as recited in claim 1 in which said grating means is a binary refraction grating.

3. A device as recited in claim 2 in which said grating means design is adjacent teeth is approximately $nh = \lambda/4$ where n is the refractive index of the grating means material, h is the thickness of the grating means, and $\lambda$ is a wavelength of interest.

4. A device as recited in claim 3 in which deviations from equality of said grating means design are less than 15 percent.

5. A device as recited in claim 4 in which said grating means has a period that is approximately equal to $\lambda/n$.

* * * * *